(12) United States Patent
Hansson (10) Patent No.: US 9,344,007 B2
(45) Date of Patent: May 17, 2016

(54) AUXILIARY RESONANT COMMUTATED POLE CONVERTER WITH VOLTAGE BALANCING CIRCUIT

(71) Applicant: COMSYS AB, Lund (SE)

(72) Inventor: Erik Hansson, Lund (SE)

(73) Assignee: COMSYS AB, Lund (SE)

( * ) Notice: Subject to any disclaimer, the term of this patent is extended or adjusted under 35 U.S.C. 154(b) by 0 days.

(21) Appl. No.: 14/653,930

(22) PCT Filed: Dec. 13, 2013

(86) PCT No.: PCT/SE2013/051506
§ 371 (c)(1),
(2) Date: Jun. 19, 2015

(87) PCT Pub. No.: WO2014/098736
PCT Pub. Date: Jun. 26, 2014

(65) Prior Publication Data
US 2015/0318794 A1    Nov. 5, 2015

Related U.S. Application Data

(60) Provisional application No. 61/739,942, filed on Dec. 20, 2012.

(30) Foreign Application Priority Data

Dec. 19, 2012 (SE) ........................................ 1251462

(51) Int. Cl.
*H02M 5/451* (2006.01)
*H02M 7/5387* (2007.01)
(Continued)

(52) U.S. Cl.
CPC .............. *H02M 7/537* (2013.01); *H02M 1/12* (2013.01); *H02M 7/5387* (2013.01);
(Continued)

(58) Field of Classification Search
CPC .......................... H02M 7/5387; H02M 5/451
USPC ...................... 363/131, 34, 37, 77, 132, 138; 327/551–559, 530–532
See application file for complete search history.

(56) References Cited

U.S. PATENT DOCUMENTS

| 6,172,882 B1 | 1/2001 | Tanaka et al. |
| 6,278,626 B1 * | 8/2001 | Teichmann ......... H02M 7/4826 363/135 |

(Continued)

FOREIGN PATENT DOCUMENTS

EP    1487094 A1    12/2004

OTHER PUBLICATIONS

International Preliminary Report on Patentability from Application No. PCT/SE2013/051506 dated Apr. 8, 2015.
(Continued)

*Primary Examiner* — Dinh T Le
(74) *Attorney, Agent, or Firm* — Calfee, Halter & Griswold LLP (57) ABSTRACT

A resonant power converter is provided. The resonant power converter comprises a balancing circuit for balancing the voltage in a feeding connection. The balancing circuit comprises: a first positive control means in series with an inductor, wherein the first positive control means and the inductor is coupled between the positive DC conductor and the feeding connection, and a second negative control means in series with the inductor, wherein the second negative control means are coupled between the negative DC conductor and the feeding connection. The first positive and second negative control means are adapted to be alternatingly switched on and off for balancing the resonant power converter, such that the voltage in the feeding connection is substantially the mean voltage of the positive DC conductor and the negative DC conductor.

11 Claims, 7 Drawing Sheets

(51) Int. Cl.
  *H02M 7/537* (2006.01)
  *H02M 1/12* (2006.01)
  *H03H 11/32* (2006.01)
  *H02M 1/00* (2006.01)
  *H02M 7/48* (2007.01)

(52) U.S. Cl.
  CPC ...... *H03H 11/32* (2013.01); *H02M 2001/0058* (2013.01); *H02M 2007/4811* (2013.01); *Y02B 70/1441* (2013.01); *Y02B 70/1491* (2013.01)

(56) References Cited

U.S. PATENT DOCUMENTS

| | | | |
|---|---|---|---|
| 7,126,833 B2 * | 10/2006 | Peng | H02M 7/4826 363/131 |
| 7,336,513 B1 | 2/2008 | Chen et al. | |
| 2011/0278953 A1 | 11/2011 | Zhang et al. | |

OTHER PUBLICATIONS

International Search Report from Application No. PCT/SE2013/051506 dated Mar. 28, 2014.

Jin-Sheng Lai "Fundamentals of a new Family of Auxiliary Resonant Snubber Inverters" 3rd International Conference on Industrial Electronics, Control and Instrumentation, 1997, pp. 645-650.

Moia J et al. "Comparison of Three-Phase PWM Rectifiers to Interface AC Grids and Bipolar DC Active Distribution Networks" 3rd IEEE International Symposium on Power Electronics for Distributed Generation Systems (PEDG), Jun. 25, 2012, pp. 221-228.

Pfisterer H J et al "A 2D-Hysteresis Current Control for a Three-Phase Voltage Source Inverter" 11th international Conference on Optimization o Electrical and Electronic Equipment, 2008, 6 pages.

* cited by examiner

AUXILIARY RESONANT COMMUTATED POLE CONVERTER WITH VOLTAGE BALANCING CIRCUIT

CROSS-REFERENCE TO RELATED APPLICATIONS

This application is the U.S. national phase entry of PCT/SE2013/051506, with an international filing date of 13 Dec. 2013, which claims the benefit of Sweden Application Serial No. 1251462-6, with a filing date of Dec. 19, 2012, and U.S. Application No. 61/739,942, with a filing date of Dec. 20, 2012, the entire disclosures of which are fully incorporated herein by reference.

TECHNICAL FIELD

The invention generally relates to an improved circuit for resonant power conversion limiting the power required for switching.

BACKGROUND

In power converters, losses appear as none of the components have ideal characteristics. The losses introduce heat in the power circuitry, which apart from consuming energy introduces thermal strain to all components, reducing the life span.

It is desirable to increase the frequency of operation of power converters as the generated output then can be more exactly controlled. Increasing the switching frequency leads to lower switching ripple, smaller component values which in turn leads to a more compact, light-weight and cost-effective implementation of the invention. Further, lower switch ripple allows for potentially lowered EMI, which in turn goes closer to the goal of a non-disturbing switch. Still further, having a high switching frequency allows for higher frequency currents to be generated by the power converter, widening the range of suitable applications for the converter.

However, increasing the frequency also increases switching losses, as most losses appear on switching cycle basis. Forcing the semiconductor to commutate while a current is running through it or when there is a voltage difference over it, requires energy which must be supplied to the semiconductor. Thus, reducing the current through the semiconductor or the voltage thereover reduces the total power input for the switch and thus the total power input to the system.

One way of reducing the losses over a particular switch is to add a resonant component to the circuitry in which a current is generated by an inductive element, by the discharge of a capacitor. A circuit employing this technique is known as a resonant converter. The use of a resonant converter enables soft switching, which reduces the energy consumed in the switching operation. There are generally two types of soft-switching: zero-voltage switching and zero-current switching. Zero-voltage switching involves minimizing the voltage difference over the switch prior to commutation, whereas zero-current switching involves minimizing the current therethrough prior to switching. For true zero-voltage switching to be possible, the resonant circuit must adjust the voltage on one side of the switch just right, such that no potential difference over the switch exists.

Generating less EMI noise is an important goal in its own right. In applications where the converter or inverter is connected directly to the grid, EMI noise can cause problems which are normally solved by employing EMC-filters. EMC-filters must be placed in series with the converter, thereby handling the full current capacity. By minimizing the EMI, EMC filters can be eliminated from the converter design.

SUMMARY

A resonant power converter is provided. The resonant power converter comprises a DC power source, a positive DC conductor, a negative DC conductor, a phase conductor, and a power converting unit coupled between the DC power source and the phase conductor. The power converting unit comprises a first switch coupled between the positive DC conductor and the phase conductor and a first diode connected in parallel with the first switch, and a second switch coupled between the negative DC conductor and the phase conductor and a second diode connected in parallel with the second switch. The power converting unit further comprises a resonant auxiliary switching circuit coupled between a feeding connection on the midpoint of a DC power source and the phase conductor. The resonant auxiliary switching circuit comprises control means for controlling a current flow through the resonant auxiliary switching circuit between the feeding connection and the phase conductor.

The resonant power converter further comprises a balancing circuit for balancing the voltage in the feeding connection. The balancing circuit comprises a first positive control means in series with an inductor. The first positive control means and the inductor is coupled between the positive DC conductor and the feeding connection. The balancing circuit further comprises a second negative control means in series with the inductor, wherein the second negative control means are coupled between the negative DC conductor and the feeding connection. The first positive and second negative control means are adapted to be alternatingly switched on and off for balancing the resonant power converter, such that the voltage in the feeding connection is substantially the mean voltage of the positive DC conductor and the negative DC conductor.

By balancing the DC power source, the resonant power converter can better reduce the voltage across the switches, such that the switching can be performed with low losses.

According to one embodiment, the resonant power converter further comprises an auxiliary capacitor coupled in parallel or in series with an inductor such that a parallel or series resonant circuit is created when a current flows through the resonant auxiliary switching circuit According to one embodiment, the first positive control means and the second negative control means are connected in series with a single inductor, in turn coupled to the feeding connection. This embodiment creates a balancing circuit with few components.

The positive and negative control means may be adapted to be switched along with the main switches, and the switching of the first main switch and the first positive control means may be synchronized, and the switching of the second main switch and the second negative control means may be synchronized, such that the DC power source is continuously balanced along with the switching of the switches.

The first positive and second negative control means may be adapted to be alternatingly switched such that the first positive control means is on substantially 50% of the time and off substantially 50% of the time, and the second negative control means is on substantially 50% of the time and off substantially 50% of the time.

The resonant power converter according to any one of the embodiments may be adapted for use in an active filter.

An active filter for reducing harmonics in an electrical system is further provided. The active filter comprises a resonant power converter according to any one of the embodiments herein, and a control unit adapted to measure voltage and/or current at a point in the electrical system, and control the switches of the resonant power converter on the basis of the measured voltage and/or current.

Balancing the DC power source of the resonant power converter in an active filter application is advantageous, as the voltage/current error that the active filter aims to correct may change vary rapidly forcing the power converter to switch against substantial voltages if the DC power source is not balanced.

The control unit may further be adapted to control the first positive and second negative control means of the resonant power converter, for balancing the DC power source of the resonant power converter, and the control unit may be adapted to control the switches and control means such that the switching of the first switch and the first positive control means is synchronized, and the switching of the second switch and the second negative control means is synchronized.

Please note that any embodiment may be combined in any way unless clearly contradictory.

BRIEF DESCRIPTION OF THE DRAWINGS

The invention is now described, by way of example, with reference to the accompanying drawing, in which.

DETAILED DESCRIPTION

The fundamentals of a power converter using resonant power conversion, or switching, will now be described by means of an example, under reference to the accompanying drawings. It will be appreciated that the drawings are for illustration only and are not in any way restricting the scope.

In the following figures, the power converter is illustrated for use in an active filter. However, this embodiment is only to be seen as an example of one use of the power converter. The inventive concept defined by the appended claims could be used in all applications in which a resonant power converter is needed, such as for example in a power transformer.

The power converter in an active filter creates a compensating current which compensates for loads in an electrical system creating harmonics. By reducing the harmonics in the electrical system, disturbances are reduced and losses in the electrical system are reduced. A further description of the details of an active filter could for example be found in U.S. Pat. No. 7,289,888 to Persson. The electrical system is illustrated in the following figures by an energy supplying unit 4, an energy consuming load 5 and a main conductor 3 for transferring energy from the energy supplying unit 4 to the energy consuming unit 5. The energy supplying unit 4 could for example be the power grid or a transformer reducing the voltage supplied from the main power grid. The energy consuming load 5 could for example be an electrical motor. The active filter further comprises an inductor L1 which transforms the pulses generated by the switches (control means) Gp, Gn to a continuous signal by opposing the changes in current through it by developing a voltage across the inductor proportional to the rate of change of the current in accordance with I=−LdU/dt. For an active filter configured for 100 A current the inductor typically is an inductor in the range 200-250 uH.

Figure 1A:
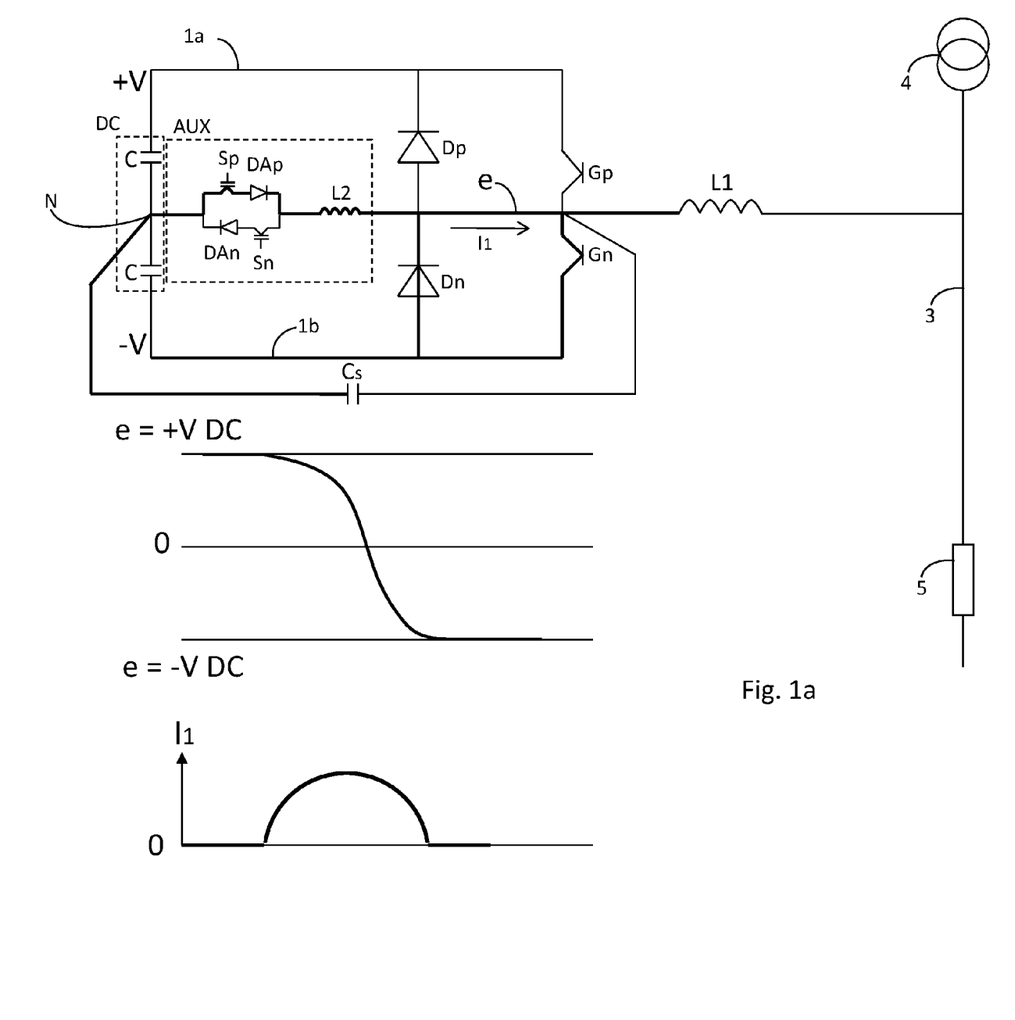
FIG. 1a shows a circuit for resonant power conversion, when the output current is switched from having the voltage +V to having the voltage −V.

FIG. 1a shows a resonant power converter for resonant power conversion. The resonant power converter comprises two main switching devices Gp, Gn per phase. The switching devices have diodes Dp, Dn connected in parallel therewith. The resonant power converter further comprises a resonant auxiliary switching circuit AUX including auxiliary switching devices (control means) Sp, Sn, coupled in series with an inductor L2 and a feeding connection N on the DC power source DC. The inductor L2 is adapted to resonate with an auxiliary capacitor Cs. The DC power source DC is according to this embodiment two capacitors C, each connected at a feeding connection N. The DC power source DC creates a positive voltage V+ in the positive conductor 1a and a negative voltage V− in the negative conductor V−. In one example, the positive voltage is +400V and the negative voltage is −400V. In the preferred embodiment, IGBTs are used for both the main switching device Gp, Gn and the auxiliary switching devices Sp, Sn, due to the high switching frequencies, but the invention is suitable for use with many types of switching devices, such as (but not limited to) BJTs, MOSFETs, MCTs, GTOs or IGCTs.

In the embodiment shown in FIG. 1a, an auxiliary capacitor $C_s$ is connected between the midpoint of the DC power source DC, (capacitors C) and the midpoint between the main switches Gp and Gn, in parallel with the inductor L2. FIG. 1a describes the operation of the resonant power converter when no current is running through L1. In order to force the voltage from +V to −V, i.e. from +400V to −400V, additional current needs to be supplied by the resonant auxiliary switching circuit AUX. As a first step in the switching cycle, the switch Gp is turned off such that the current ceases to flow from the positive conductor 1a. The voltage in the phase conductor e is now the positive voltage +V and no current is flowing. The switch Sp is turned on closing the resonant circuit causing the capacitor $C_s$ to discharge through the switch Sp and the diode DAp and thus altering the potential difference over the inductor L2, creating a current which is supplied to the phase conductor e. The resonant auxiliary switching circuit AUX thus supplies a forcing potential substantially equal to half the voltage difference between −V and +V, inducing a magnetic field in the inductor L2 which keeps the current flowing through the inductor causing the potential in the phase conductor e to go down towards −V. By means of the inductor L2 driving the current, the forcing potential causes a voltage drop from +400V to −400V. When the drop in voltage is concluded, current starts to flow through the negative diode Dn. At this point, the potential difference over the negative switch Gn is reduced such that Gn can be switched without any voltage thereacross.

Figure 1B:
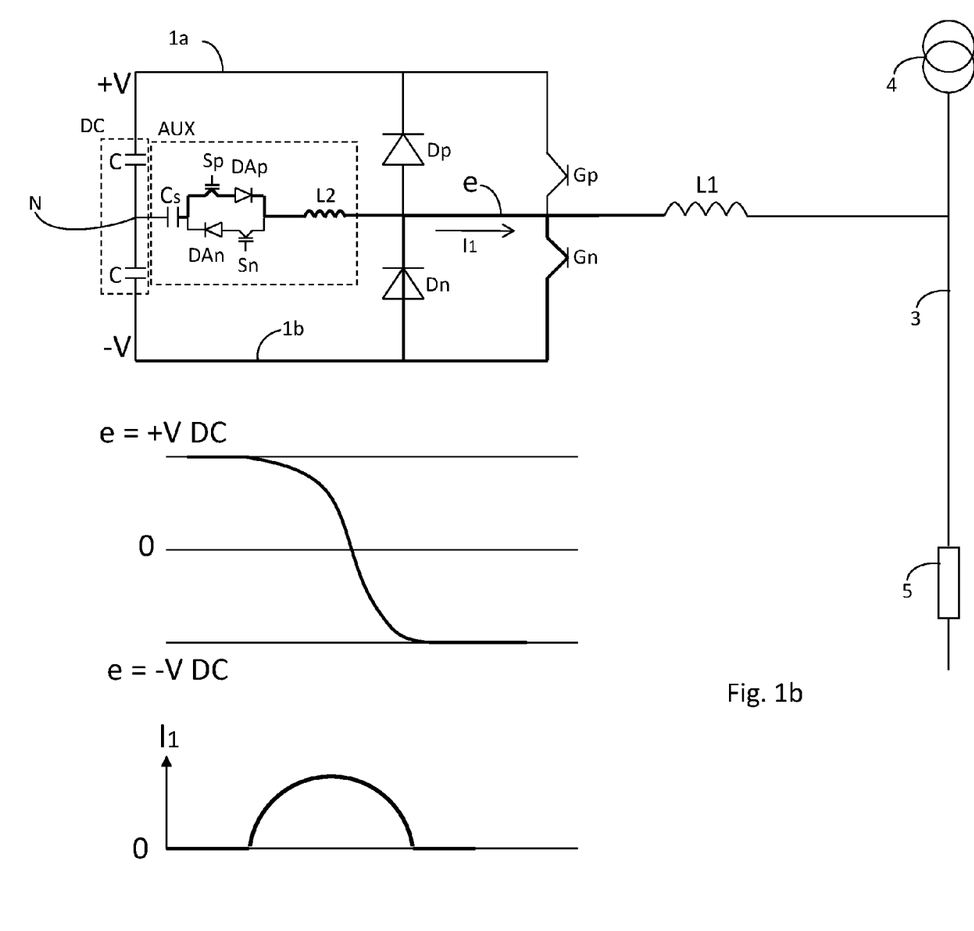
FIG. 1b shows an alternative embodiment of a circuit for resonant power conversion, when the output current is switched from having the voltage +V to having the voltage −V.

FIG. 1b shows an alternative embodiment of the resonant power converter, which is functionally equivalent. In the circuitry shown in FIG. 1b, the auxiliary capacitor Cs is connected between the midpoint N of the DC power source DC (capacitors C) and the auxiliary switching circuit AUX, in series with the inductor L2. Just as FIG. 1a, FIG. 1b describes the operation of the resonant power converter when no current is running through the inductor L1.

Figure 2:
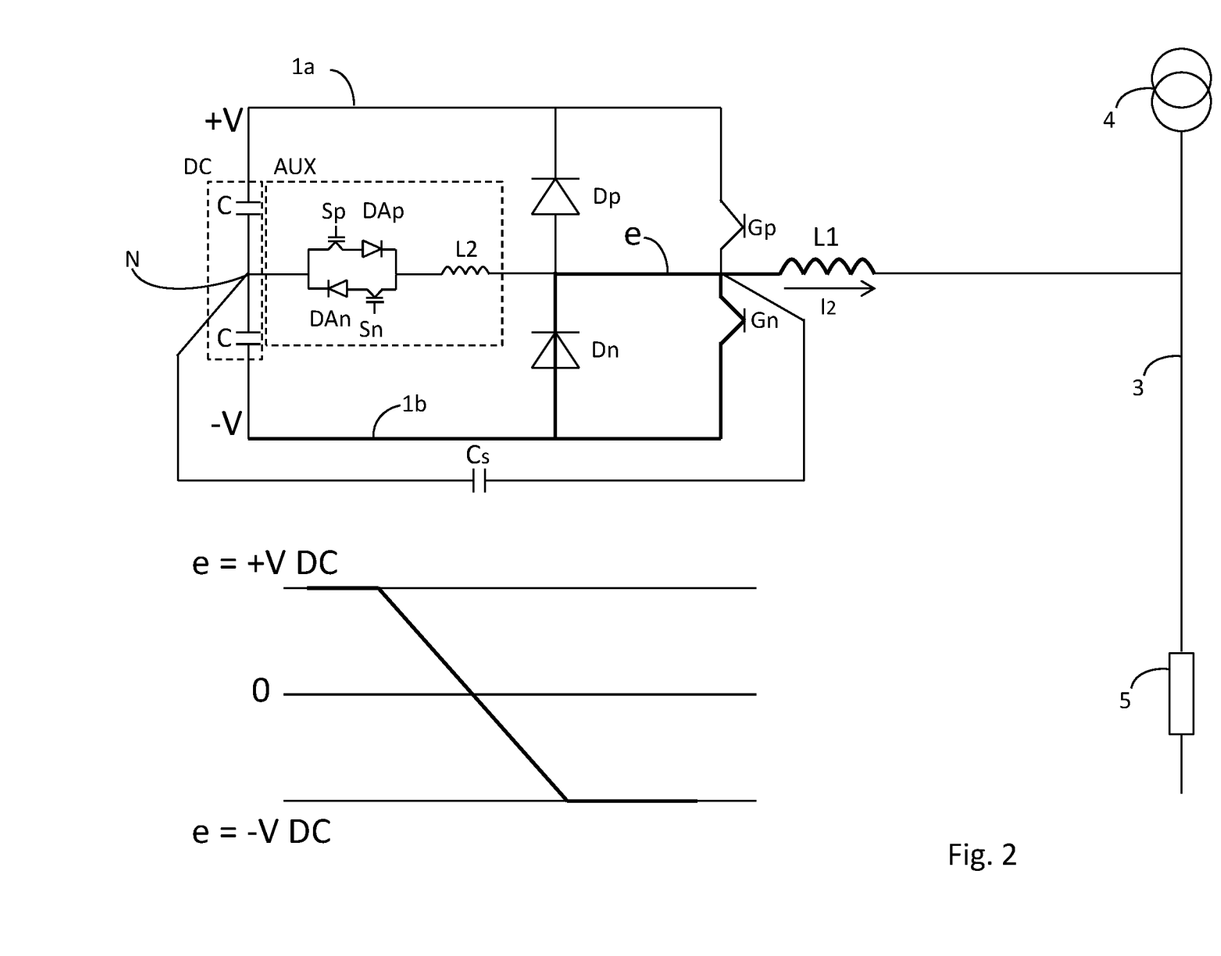
FIG. 2 shows a circuit for resonant power conversion, when the output current is switched from having the voltage +V to having the voltage −V.

FIG. 2 shows a second alternative in which the object is to switch from +V to −V when a current is flowing through L1. The positive switch Gp is turned off, however, as L1 holds a magnetic field it will continue to drive a current 12 therethrough from the diode Dn causing the voltage in the main lead to drop from +V to −V thus reducing the voltage difference over switch Gn such that the switch Gn can be switched with very small losses.

Figure 3A:
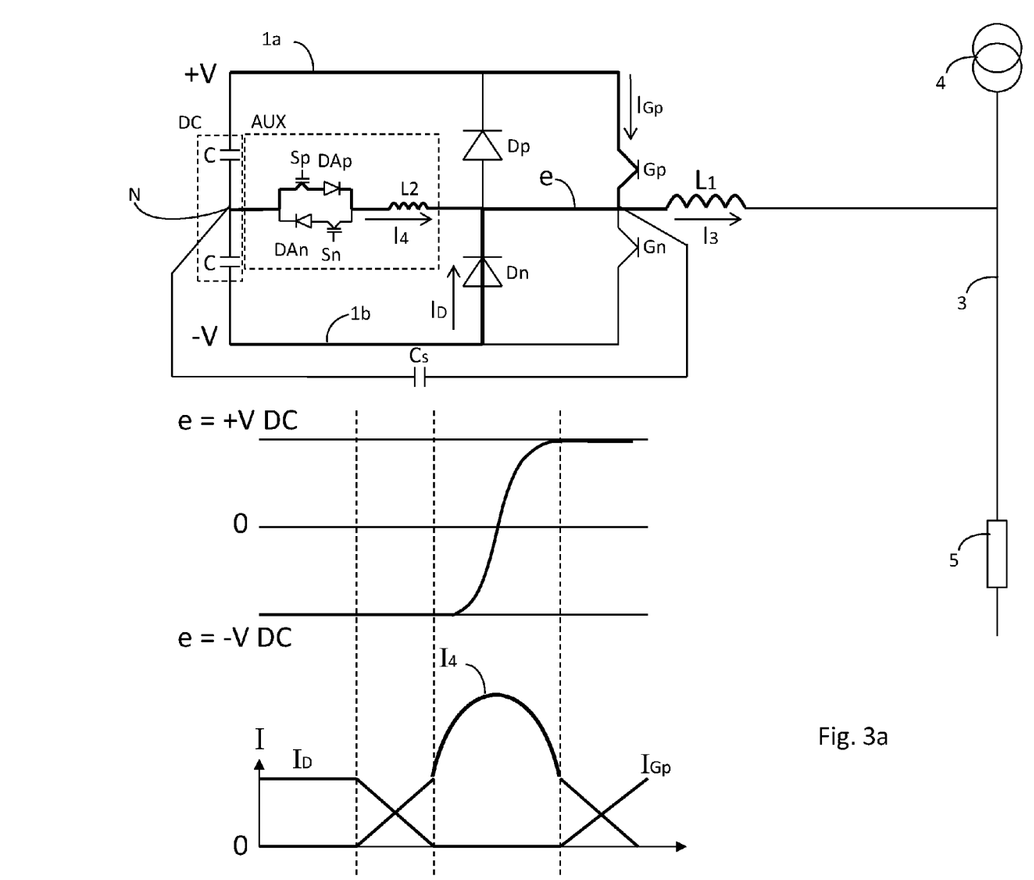
FIG. 3a shows a circuit for resonant power conversion, when the output current is switched from having the voltage −V to having the voltage +V.

FIG. 3a shows a third switching operation in which switching is performed from −V to +V when a current is flowing through the inductor L1. As a first step, the negative switch Gn is turned off causing a current 13 driven by the inductor L1 to continue to run through the negative diode Dn (denoted as diode current Id). Sp is turned on, closing the resonant auxiliary switching circuit AUX discharging Cs and driving an auxiliary current 14 by means of the inductor L2, causing the voltage to rise in the main lead and thus lowering the voltage difference over Gp. When the voltage over Gp is approaching zero, Gp is turned on and the current IGp starts to flow through Gp and Sp is turned off. The voltage of the flowing current 13 is thus shifted from −V to +V via current supplied by the auxiliary circuit AUX, such that, at the end of the switching cycle, the current flows through the positive main switch Gp.

For the resonant auxiliary switching circuit AUX to supply sufficient forcing potential to the circuitry in FIG. 1a and 3a, such that the voltage in the phase conductor e changes from +V to −V and from −V to +V respectively, the voltage of the DC power source needs to be substantially equal to half the voltage difference between −V and +V, which is the case in the embodiments shown in FIGS. 1-3a. However, due to the asymmetry of the components of the resonant power converter, i.e. the values of the components, such as resistance, inductance etc. deviating from the nominal values, and due to the fact that the calculated nominal values of the components of the resonant power converter in practice deviates from the nominal values of an ideal circuit, the resonant power converter is asymmetric, which in turn means that the resonant auxiliary switching circuit is not ideal for reducing the voltage across the switches Gp, Gn.

Figure 3B:
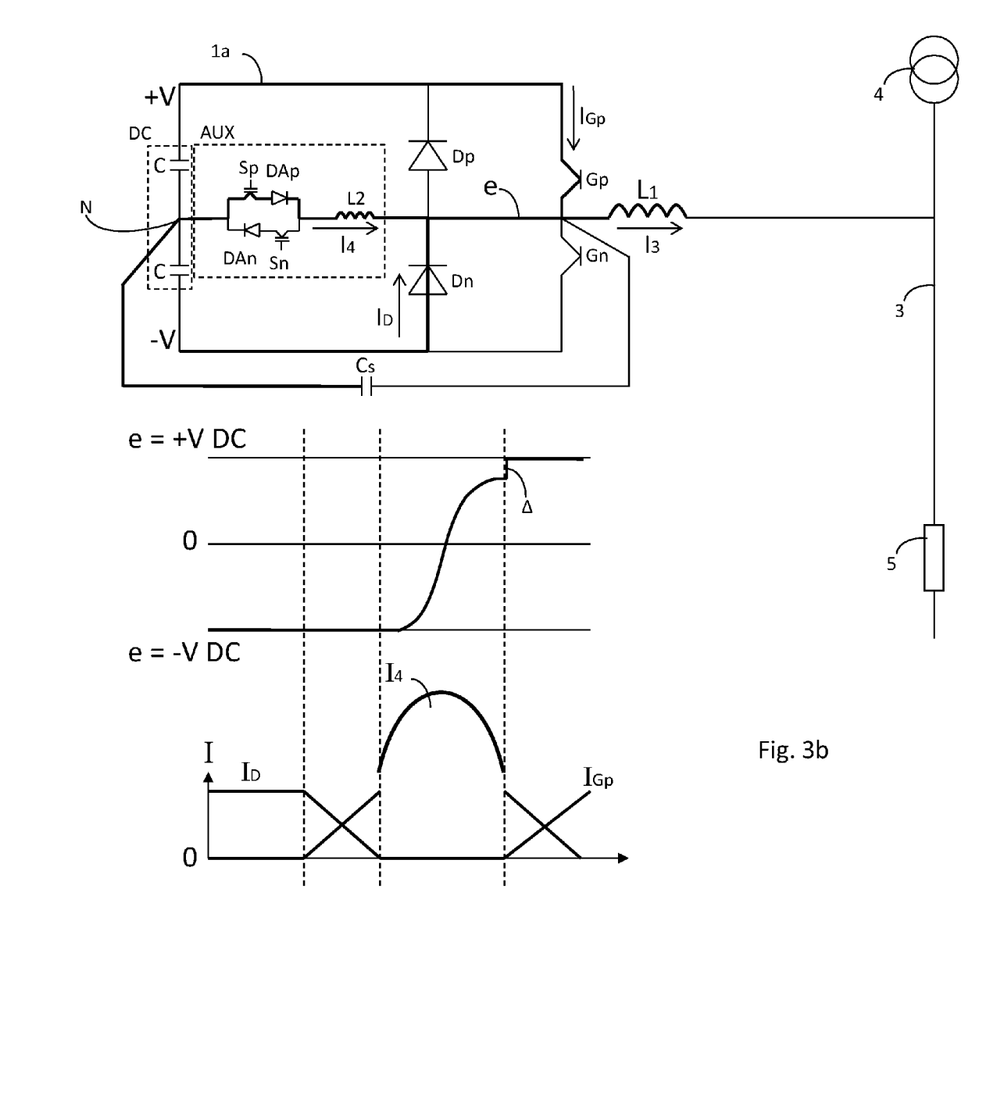
FIG. 3b shows the circuit for resonant power conversion shown in FIG. 3a, with the difference that the DC power source is imbalanced.

In the switching operation described in FIG. 3a, the resonant auxiliary switching circuit AUX aims to alter the voltage in the phase conductor e from −400 to +400V such that the positive switch Gp can be switched without any voltage across, and thus with very little losses. FIG. 3b shows an embodiment in which the DC power source DC is asymmetric, the positive conductor 1a has a potential of +405V, instead of the nominal +400V, the negative conductor 1b has a potential of −395V instead of the nominal −400V, and the voltage at the feeding connection N remains at the nominal half of the nominal positive and negative voltage, i.e. 0V. The imbalance results in that, in the described case, the potential difference that the resonant auxiliary switching circuit AUX can use to create a resonant current altering the voltage at the phase conductor e is the difference between the voltage in the feeding conductor N and the voltage in the positive conductor 1a, i.e. 405V. To switch without potential difference over Gp, the voltage of the phase conductor e needs to be shifted from the voltage of the negative conductor 1b (−395V) to the voltage of the positive conductor 1a (+405V). However, the potential difference between the voltage of the feeding connection N, having the nominal voltage of 0V, and the negative conductor 1b is only 395V, resulting (in an ideal circuit) in that the resonant auxiliary switching circuit AUX only can alter the voltage of the phase conductor e with 790V, resulting in a voltage in the phase conductor e of +395V at the end of the resonant transition, leaving a potential difference in the switching moment of 10V, denoted as Δ in the diagram of FIG. 3b. The positive switch Gd will thus have to commutate while a potential difference of 10V is present thereacross. Further, if the asymmetry is very large the resonant circuit capacitor Cs will be kept from starting the resonance together with L2 and hence prohibit proper operation of the resonant switch. As the capacitor Cs is coupled to the point N and to the phase conductor e, the asymmetry of the DC power source will short-circuit Cs when the main switches Gp, Gn are switched on, which will thermally damage Cs.

In one example, the resonant power converter is used in an active filter for creating a compensating current, compensating for a time difference between the waveforms of voltage and current. The difference between voltage and current may in some cases rapidly become very large, resulting in the resonant power converter having to produce a positive or negative compensating current for a relatively long time period, draining one of the capacitors of the DC power source, such that in an extreme example, the voltage in one of the conductors is 0 volts, whereas the voltage in the other conductor remains at the nominal value.

Figure 4:
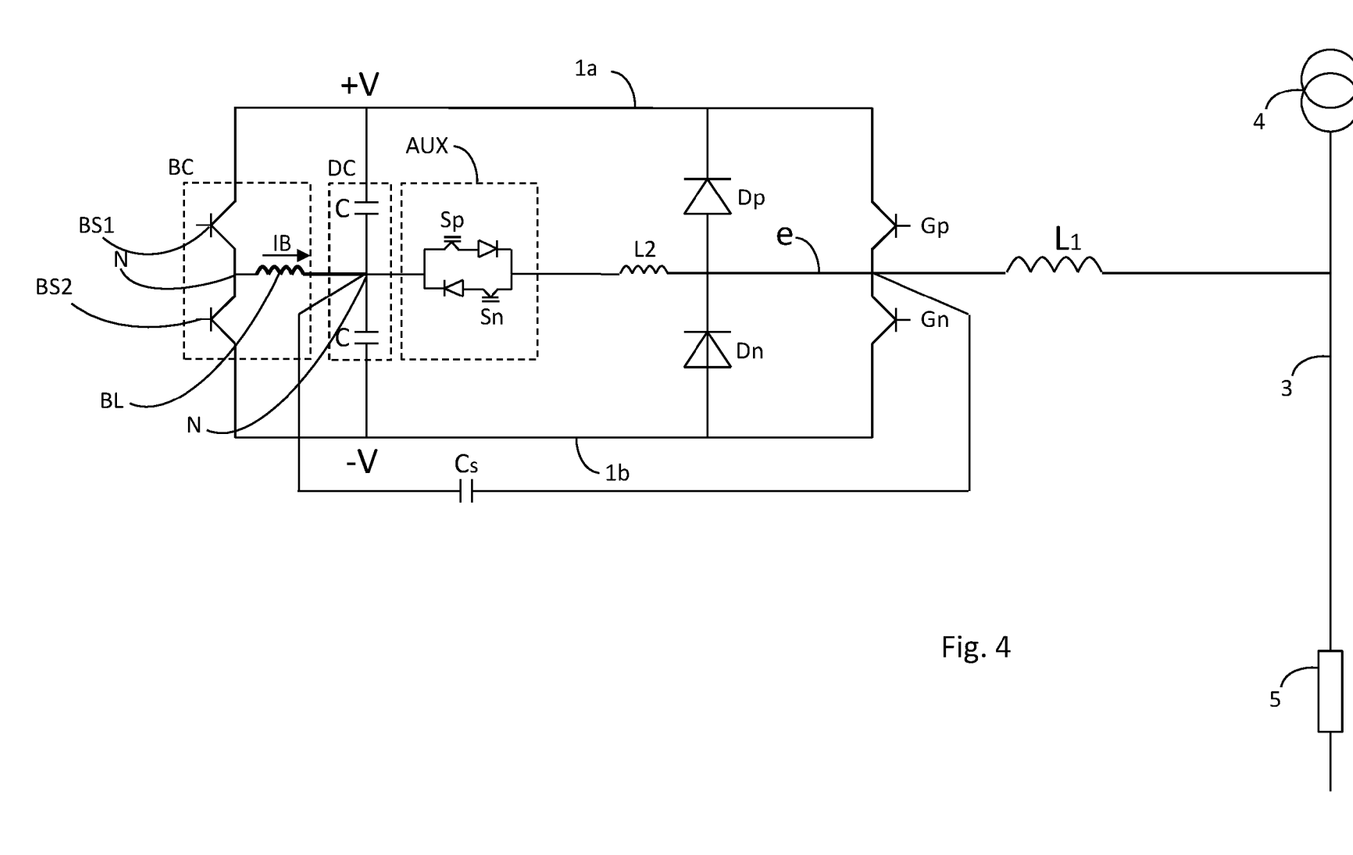
FIG. 4 shows a circuit for resonant power conversion comprising a balancing circuit.

FIG. 4 shows a circuit similar to the circuits shown in FIGS. 1-3, with the difference that the circuit additionally comprises a balancing circuit BC for balancing the feeding connection N of the DC power source DC, such that the potential at the feeding connection N always remain at substantially half the voltage difference between the negative conductor 1b and the positive conductor 1a. The balancing circuit BC comprises a first and second balancing switch (control means) BS1, BS2, in this example being a first and second IGBT, and a balancing inductor BL. The balancing switches BS1, BS2 alternate such that the first BS1, and second BS2, balancing switches are on and off substantially 50% of the time, respectively. During the on time of the first balancing switch BS1, the potential difference over the inductor BL induces a magnetic field which is drained when the first switch BS1 is turned off and the second switch BS2 is turned on. No current will be running through the inductor BL as long as the potential difference over BL is 0 at the end of each balancing cycle. However, in the case when the balancing inductor BL is not fully drained due to imbalance in the DC power source, i.e. the feeding connection has a potential other than substantially half of the potential difference between the positive 1a and negative 1b conductor, a current IB runs through the balancing inductor BL adjusting the voltage of the feeding connection N, such that the voltage of the feeding connection N is returned to substantially half of the voltage difference between the positive 1a and negative 1b conductor. If the symmetry of DC power source is not maintained, the asymmetry of the resonant power converter may increase and ultimately remove the effect of the resonant portion of the power converter entirely.

The first and second balancing switches BS1, BS2 are controlled by the same control unit controlling the main switching devices Gn and Gp, such that the balancing switches BS1, BS2 are switched along with the main switching device Gn and Gp.

Figure 5:
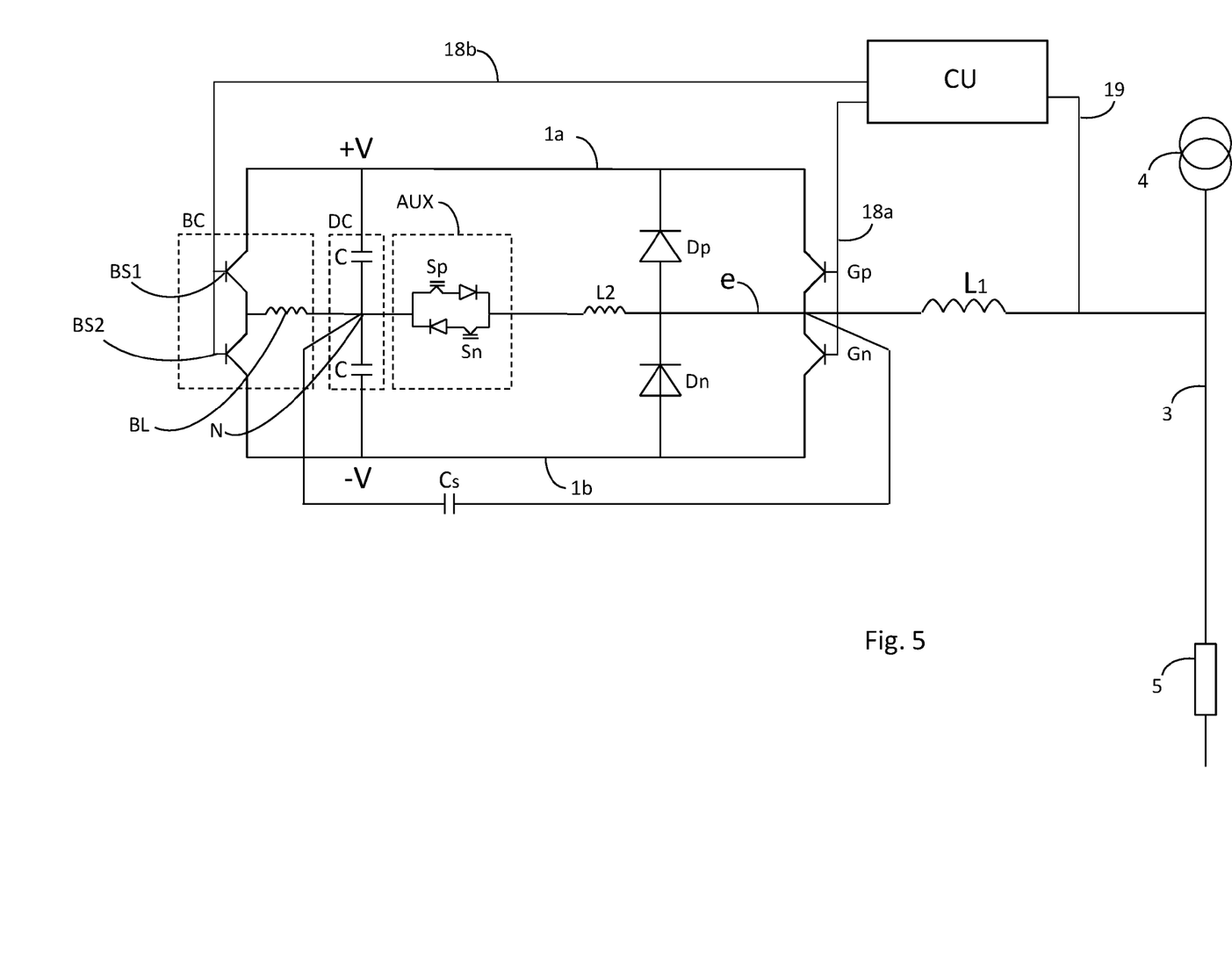
FIG. 5 shows an embodiment of an active filter comprising the circuit for resonant power conversion.

FIG. 5 shows an active filter comprising the resonant power converter described with reference to FIG. 4. The active filter is coupled to an electrical system 3, 4, 5 and is adapted to create a compensating current which compensates for loads in the electrical system 3, 4, 5 creating harmonics. By reducing the harmonics in the electrical system 3, 4, 5, the reactive effect produced is reduced and thus the overall energy consumption in the electrical system is lowered.

The active filter comprises a control unit CU adapted to receive a measurement signal via a measurement conductor 19. The measurement signal comprises the voltage and current of the electrical system, such that a difference between the waveforms of the voltage and current of the electrical system can be derived. The control unit CU calculates a compensating current for compensating for the difference in time between the waveforms of the voltage and current, which is realized as a pulse width modulation (PWM) signal communicated to the main switches Gp, Gn of the resonant power converter by means of a control lead 18a. The control unit CU also controls the balancing switches BS1, BS2, such that the balancing switches BS1, BS2 switch along with the main switches Gn, Gp, continuously balancing the DC power source DC such that the point N remains at a voltage being half of the potential difference between the positive and negative DC conductor. The control unit (CU) is thus adapted to control the main switches Gp, Gn and balancing switches BS1, BS2 such that the switching of the first main switch Gp and the first positive control means BS1 is synchronized, and the switching of the second main switch Gn and the second negative control means BS2 is synchronized.

The control unit CU may comprise a single CPU (Central processing unit), or could comprise two or more processing units. For example, the processor may include a general purpose microprocessor, an instruction set processor and/or related chips sets and/or special purpose microprocessors such as ASICs (Application Specific Integrated Circuit). The processor may also comprise board memory for caching purposes.

Please note that any embodiment or part of embodiment could be combined in any way. All examples herein should be seen as part of the general description and therefore possible to combine in any way in general terms.

The invention claimed is:

1. A resonant power converter comprising:
a DC power source;
a positive DC conductor;
a negative DC conductor;
a phase conductor; and
a power converting unit coupled between the DC power source and the phase conductor, the power converting unit comprising:
 a first switch coupled between the positive DC conductor and the phase conductor and a first diode connected in parallel with the first switch,
 a second switch coupled between the negative DC conductor and the phase conductor and a second diode connected in parallel with the second switch, and
 a resonant auxiliary switching circuit coupled between a feeding connection on the DC power source and the phase conductor, the resonant auxiliary switching circuit comprising a control for controlling a current flow through the resonant auxiliary switching circuit between the feeding connection and the phase conductor; a balancing circuit for balancing a voltage in the feeding connection, the balancing circuit comprising:
  a first positive control in series with an inductor, wherein the first positive control and the inductor are coupled between the positive DC conductor and the feeding connection, and
  a second negative control in series with the inductor, wherein the second negative control is coupled between the negative DC conductor and the feeding connection,
 wherein the first positive and second negative controls are configured to be alternatingly switched on and off for balancing the resonant power converter, such that the voltage in the feeding connection is substantially a mean voltage of the positive DC conductor and the negative DC conductor.

2. The resonant power converter according to claim 1, further comprising an auxiliary capacitor coupled in parallel with an inductor such that a parallel resonant circuit is created when a current flows through the resonant auxiliary switching circuit.

3. The resonant power converter according to claim 1, further comprising an auxiliary capacitor coupled in series with an inductor such that a series resonant circuit is created when a current flows through the resonant auxiliary switching circuit.

4. The resonant power converter according to claim 1, wherein the first positive control and the second negative control are connected in series with a single inductor, in turn coupled to the feeding connection.

5. The resonant power converter according to claim 1, wherein the positive and negative controls are adapted to be controlled along with the switches.

6. The resonant power converter according to claim 5, wherein the switching of the first switch and the first positive control is adapted to be synchronized, and the switching of the second switch and the second negative control is adapted to be synchronized.

7. The resonant power converter according to claim 1, wherein the first positive and second negative controls are adapted to be alternatingly switched such that the first positive control is on substantially 50 percent of the time and off substantially 50 percent of the time, and the second negative control is on substantially 50 percent of the time and off substantially 50 percent of the time.

8. An active filter comprising the resonant power converter of claim 1.

9. An active filter for reducing harmonics in an electrical system, the active filter comprising the resonant power converter of claim 1 and further comprising a control unit configured to:
measure at least one of voltage or current at a point in the electrical system, and
control the switches of the resonant power converter based on the measured at least one of voltage or current.

10. The active filter according to claim 9, wherein the control unit is further configured to control the first positive and second negative controls of the resonant power converter for balancing the DC power source of the resonant power converter.

11. The active filter according to claim 10, wherein the control unit is further configured to control the switches and first positive and second negative controls such that the switching of the first switch and the first positive control is synchronized, and the switching of the second switch and the second negative control is synchronized.

* * * * *